United States Patent
Razeghi-Jahromi et al.

(10) Patent No.: US 12,372,567 B2
(45) Date of Patent: Jul. 29, 2025

(54) SYSTEMS AND METHODS FOR REAL-TIME DETECTION OF HIGH IMPEDANCE FAULTS IN DISTRIBUTION SYSTEMS

(71) Applicant: ABB Schweiz AG, Baden (CH)

(72) Inventors: Mohammad Razeghi-Jahromi, Cary, NC (US); Moein Choobineh, Cary, NC (US); Rostan Rodrigues, Cary, NC (US)

(73) Assignee: ABB SCHWEIZ AG, Baden (CH)

( * ) Notice: Subject to any disclaimer, the term of this patent is extended or adjusted under 35 U.S.C. 154(b) by 21 days.

(21) Appl. No.: 18/350,183

(22) Filed: Jul. 11, 2023

(65) Prior Publication Data

US 2025/0020708 A1    Jan. 16, 2025

(51) Int. Cl.
    G01R 31/08    (2020.01)
(52) U.S. Cl.
    CPC .................. *G01R 31/086* (2013.01)
(58) Field of Classification Search
    None
    See application file for complete search history.

(56) References Cited

U.S. PATENT DOCUMENTS

| | | | |
|---|---|---|---|
| 2014/0288351 A1* | 9/2014 | Jones .................. | A61N 5/0624 607/90 |
| 2022/0285944 A1* | 9/2022 | Drummond ............. | H02J 3/242 |

OTHER PUBLICATIONS

Zhang, Yongjie et al.; "A Transfer Learning-Based High Impedance Fault Detection Method Under a Cloud-Edge Collaboration Framework"; IEEE Access; vol. 8, 2020; pp. 165099-165110.
Hou, Daqing; "Detection of High-Impedance Faults in Power Distribution Systems"; Schweitzer Engineering Laboratories, Inc.; Mar. 2007; pp. 1-12.
Tengdin, John; "High Impedance Fault Detection Technology"; Report of PSRC Working Group D15; Mar. 1996; pp. 1-12.
Ghaderi, Amin; "High Impedance Fault Detection: A Review"; Electric Power Systems Research; Oct. 2016; pp. 1-15.

* cited by examiner

*Primary Examiner* — Farhana A Hoque
(74) *Attorney, Agent, or Firm* — Greenberg Traurig, LLP (57) ABSTRACT

A system and method for detecting high impedance faults (HIFs) in an electrical distribution system may include obtaining a first current signal of a first electrical conductor, determining, based on a time period, a first moving window for the first current signal and a second moving window for a second current signal, determining a first instantaneous phase of the first moving window and a second instantaneous phase of the second moving window, determining a first frequency spectrum and a second frequency spectrum based on the first instantaneous phase and second instantaneous phase respectively, determining an error spectrum corresponding to a difference between points of the first frequency spectrum and the second frequency spectrum respectively, generating an error index based on the error spectrum, and identifying a trigger event at the first electrical conductor based on a comparison between the error index and a reference threshold.

20 Claims, 4 Drawing Sheets

SYSTEMS AND METHODS FOR REAL-TIME DETECTION OF HIGH IMPEDANCE FAULTS IN DISTRIBUTION SYSTEMS

FIELD

The present disclosure relates to the field of electrical distribution systems. More particularly, to detection of impedance faults in distribution systems.

BACKGROUND

A high impedance fault (HIF) is an abnormal circuit condition resulting from electrical contact of an energized conductor with a non-conductive surface, such as, for example, sod, grass, tree branches, asphalt, or concrete. A HIF is frequently accompanied by electric arc(s), which renders the fault current unpredictable and poses a risk to electrical equipment and human life. Depending on the type of surface involved, the fault resistance may also change as a result of the heat produced by the arc, thereby randomly causing the magnitude of the fault current to change. Accordingly, fault current magnitudes and frequency contents can also change depending on the ground conditions and based on the ground conditions changing due to the fault-generated heat. Therefore, HIFs can result in a wide variation of current waveform shapes, magnitudes, and frequency content, which makes reliable detection difficult.

SUMMARY

In some embodiments, a method includes obtaining, by a computing device, a first current signal corresponding to a first electrical conductor of an electrical distribution system, determining, by the computing device, based on a time period, a first moving window for the first current signal, determining, by the computing device, based on the time period, a second moving window for a second current signal, the second current signal being generated based on the first current signal, generating, by the computing device, an error index for the first electrical conductor based on the first moving window and the second moving window, and identifying, by the computing device, a trigger event at the first electrical conductor based on a comparison between the error index and a reference threshold.

In some embodiments, the electrical distribution system includes more than one electrical conductor corresponding to a multi-phase system.

In some embodiments, the second current signal includes a pure sinusoidal wave signal generated based on the first current signal, the second current signal having a same length and phase as the first current signal.

In some embodiments, the method further includes determining, by the computing device, a first instantaneous phase of the first moving window and a second instantaneous phase of the second moving window, and determining, by the computing device, a first frequency spectrum based on the first instantaneous phase and a second frequency spectrum based on the second instantaneous phase.

In some embodiments, the first frequency spectrum and the second frequency spectrum include spectral data transformed from the first instantaneous phase of the first moving window and the second instantaneous phase of the second moving window.

In some embodiments, the method further includes determining, by the computing device, an error spectrum including one or more values corresponding to a difference between points from the first frequency spectrum and the second frequency spectrum respectively, wherein the error index includes a sum of the error spectrum.

In some embodiments, the first current signal includes a frequency and a phase. In some embodiments, the first moving window is defined based on a signal length.

In some embodiments, the second current signal further includes the frequency and phase of the first current signal and the second moving window includes a same signal length as the first moving window.

In some embodiments, the signal length includes at least one cycle of the first current signal and second current signal.

In some embodiments, the method further includes adaptively determining, by the computing device, the reference threshold based on the other electrical conductors of the electrical distribution system that are not undergoing the trigger event. In some embodiments, the reference threshold includes a parameter defining a sensitivity of detecting the trigger event.

In some embodiments, the method further includes applying, by the computing device, a smoothing filter to refine the error index to facilitate identifying the trigger event.

In some embodiments, the trigger event includes a high impedance fault (HIF).

In some embodiments, a system includes a current sensor, a processor, and one or more non-transitory computer readable medium having stored thereon instructions that are executable by the processor to enable the system to perform operations including obtain a first current signal corresponding to a first electrical conductor of an electrical distribution system, determine, based on a time period, a first moving window for the first current signal, determine, based on the time period, a second moving window for a second current signal, the second current signal being generated based on the first current signal, the second current signal including a pure sinusoidal wave signal generated based on the first current signal, the second current signal having a same length and phase as the first current signal, determine a first frequency spectrum based on the first moving window and a second frequency spectrum based on the second moving window, generate an error index for the first electrical conductor based on first moving window and the second moving window, and identify a trigger event for the first electrical conductor based on a comparison between the error index and a reference threshold.

In some embodiments, the system may further perform operations including determine a first instantaneous phase of the first moving window and a second instantaneous phase of the second moving window, the first frequency spectrum and the second frequency spectrum include spectral data transformed from the first instantaneous phase of the first moving window and a second instantaneous phase of the second moving window respectively, and determine an error spectrum including one or more values corresponding to a difference between points from the respective first frequency spectrum and the second frequency spectrum, the error index includes a sum of the error spectrum.

In some embodiments, the system may further perform operations including adaptively determining the reference threshold based on the other electrical conductors of the electrical distribution system that are not undergoing the trigger event, the reference threshold includes a parameter defining a sensitivity of detecting the trigger event.

In some embodiments, the first current signal includes a frequency and a phase. In some embodiments, the first moving window is defined based on a signal length. In some embodiments, the second current signal further includes the frequency and phase of the first current signal and the second moving window includes a same signal length as the first moving window.

In some embodiments, the trigger event includes a high impedance fault (HIF).

In some embodiments, an electrical distribution system includes an HIF detector including one or more sensors, a processor, and a non-transitory computer readable medium having stored thereon instructions that are executable by the processor to enable the HIF detector to perform operations including obtain a first current signal corresponding to a first electrical conductor of an electrical distribution system, determine, based on a time period, a first moving window for the first current signal, determine, based on the time period, a second moving window for a second current signal, the second current signal being generated based on the first current signal, determine a first instantaneous phase of the first moving window and a second instantaneous phase of the second moving window, determine a first frequency spectrum based on first instantaneous phase and the first moving window and a second frequency spectrum based on the second instantaneous phase and the second moving window, determine an error spectrum including one or more values corresponding to a difference between points from the first frequency spectrum and the second frequency spectrum respectively, generate an error index for the first electrical conductor based on first moving window and the second moving window, and identify a trigger event for the first electrical conductor based on a comparison between the error index and a reference threshold.

In some embodiments, the second current signal includes a pure sinusoidal wave signal generated based on the first current signal, the second current signal having a same length and phase as the first current signal. In some embodiments, the first current signal includes a frequency and a phase. In some embodiments, the first moving window is defined based on a signal length. In some embodiments, the second current signal further includes the frequency and phase of the first current signal and the second moving window includes a same signal length as the first moving window.

In some embodiments, the HIF detector further performs operations including adaptively determine the reference threshold based on the other electrical conductors of the electrical distribution system that are not undergoing the trigger event. In some embodiments, the reference threshold includes a parameter defining a sensitivity of detecting the trigger event.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

A high impedance fault ("HIF") in an electrical distribution systems can be difficult to detect and threatens the reliability of electrical utility systems. During an HIF, an electric arc phenomenon can occur that results in small fault currents and presents with non-linear and asymmetrical waveforms. Accordingly, an HIF may not be detectable by conventional overcurrent protection devices such as fuses, re-closers, relays, or the like. In certain instances, detection by other conventional HIF detection methodologies may not detect an HIF or they may be inconsistent and unreliable due to the signal data presented and measured as a result of an HIF.

Approximately 25% to 30% of distribution network faults are considered HIFs. However, less than 20% of HIFs can be recorded and cleared by conventional detection methods. HIF detection methods, as known in the art, are generally divided into three approaches: model-based, feature-based, and data-based. Model-based methods directly analyze and describe the arc process from an HIF and compares the results to a plurality of known models, each model corresponding to a respective HIF type. However, different contact surfaces can have differing effects on the arc phenomenon, thereby resulting in different signal characteristics. Therefore, each model of a model-based method can typically only provide indications corresponding to one specific type of HIF, such as vegetation HIFs, soil-grounding HIFs, underwater cable HIFs, etc. Accordingly, this method is not capable of providing a single model representative of multiple types of HIFs or may not be capable of detecting HIFs where the measured phase current signal does not correspond to an available model.

Feature-based methods, as known in the art, extract the general features from a dataset indicative of an HIF by applying algorithmic functions to the data and determining the HIF based on setting fixed thresholds and performing a comparison between the extracted features and the fixed thresholds. However, it can be difficult to detect that an HIF has occurred based on relying on fixed thresholds as they can also be unreliable for similar reasons as the model-based approach. Establishing fixed thresholds for HIF detection is further limited by the non-linear and asymmetrical waveforms which results from the arc phenomena. Additionally, data-based methods typically utilize supervised learning models such as, for example, decision trees, random forest, support vector machine, neural networks, deep learning algorithms, etc. The data-based approach is typically limited by the differentiation of the extracted features and the scale of the labeled data. Moreover, only a small amount of HIF data can be recorded and utilized in data-based approaches.

The various embodiments described herein relate to systems, devices, computer-implemented methods, and computer program products capable of providing HIF detection having high detection capabilities and low false positive rates. The present embodiments may relate to a system capable of HIF detection in real time, or near real time, based on measurements of a phase current signal at an electrical distribution system. Additionally, the system may be capable of performing HIF detection using the phase current signal even when the fault is occurring at a remote location from the location of the measurement device, as will be further described herein.

Accordingly, the present embodiment relates to systems, devices, and methods configured to obtain a phase current signal, extract features from the phase current signal based on a moving window and based on a generated reference signal, calculate frequency spectra corresponding to an instantaneous phase of the phase current signal and the reference signal defined by the moving window, calculate an error index based on a comparison between the frequency spectra, and identify a trigger event indicative of the HIF based on a comparison between the error index and a reference threshold. In some embodiments, the error index is a sum of the difference between the frequency spectra corresponding to the first current signal and the frequency spectra corresponding to the reference signal. Accordingly, as the phase current signal becomes distorted as a result of the HIF, the presence of the HIF is effectively detected based on the reference threshold. In some embodiments, the reference threshold is a parameter that may be adaptively calculated by training the threshold based on a portion of the phase current signal that does not correspond to the HIF (e.g., a normal signal measured during a previous period of time). In some embodiments, the reference threshold may be based on a portion of the first current signal. In other embodiments, the reference threshold may be based on one or more other phase current signals of a multi-phase signal that are not indicative of the HIF.

The system detects HIFs based on calculating the error index corresponding to the phase current signal, e.g., one feature, and not by extrapolating the HIF based on a trained model or based on a plurality of fixed thresholds. In this regard, the present embodiments are capable of performing HIF detection in a computationally more efficient manner, thereby reducing processing time and reducing the number of cycles required for the HIF detection. Additionally, HIF detection based on the error index is more easily interpretable compared to other known techniques, thereby resulting in more reliable HIF detection resulting from a plurality of different causes without the need for supervised training and different models/thresholds for each fault type. The system is also capable of working under different grounding systems such as high, low, and zero resistance. The system is also capable of being implemented on a variety of different platforms/architectures with computational capabilities such as on a server, cloud, substation computer, protection relay/IED at the edge, or other like devices.

The system is capable of real-time detection of HIFs by calculating an HIF index in a moving window for the phase current signal. In this regard, the system monitors a frequency spectrum corresponding to the instantaneous phase of the windowed signal of up to half of the sampling frequency, i.e., fs/2, to continuously capture current signals indicative of HIFs rather than by relying on infrequent fluctuations or by inter-harmonics. For example, for a phase current signal having a frequency of 4800 Hz, the system may monitor a frequency spectrum of up to fs/2=4800/2=2400 Hz. As such, in some embodiments, the frequency spectrum corresponding to the instantaneous phase of the windowed signal may not be a fixed number but may instead be a user dependent variable provided as input to the HIF algorithm. Additionally, in some embodiments, the sampling frequency and the frequency spectrum corresponding to the instantaneous phase of the windowed signal may depend on the sampling capacity of the installed hardware being used to monitor the phase current signal.

Additionally, the system is capable of detecting HIFs without the need for supervised training data or labeled data and the system also detects HIFs with a low false positive rate compared to traditional approaches.

It is to be appreciated by those having ordinary skill in the art that applying one or more algorithms to electrical signal data obtained from a measuring device monitoring phase current signals at an electrical distribution system and transforming said electrical signals to frequency spectra for the purposes of enabling the system to calculate an error index and identifying the presence of HIFs based on a comparison between the error index and an adaptively determined reference threshold based on the electrical current signals of the other phases of the electrical distribution system does not fall under human observation as the human mind alone is not capable of performing such processes for HIF detection, in accordance with the present disclosure.

It is to be appreciated by those having ordinary skill in the art that the application of one or more algorithms for performing the HIF detection in accordance with the present disclosure is not a recitation of the one or more algorithmic functions as the directed improvement nor an attempt to encompass the one or more algorithmic functions by the mere recitation of the one or more algorithmic functions applied by a generic computing device. Instead, the algorithmic functions described herein are applied to transform electrical signal data, e.g., phase current signals, to frequency spectra indicative of instantaneous phases of windowed phase current signals to enable the determination of an error index and to identify the presence of HIFs having different arc characteristics (i.e., indicative of different types of HIFs) at the electrical distribution system without the need for a plurality of HIF detection models, supervised learning models, and/or by setting fixed thresholds for comparison to extracted features from phase current signals. In this regard, the various embodiments of the present disclosure relate to a system capable of performing HIF detection based on phase current signals with improved accuracy and reliability as compared to other systems and methods known in the prior art.

Figure 1:
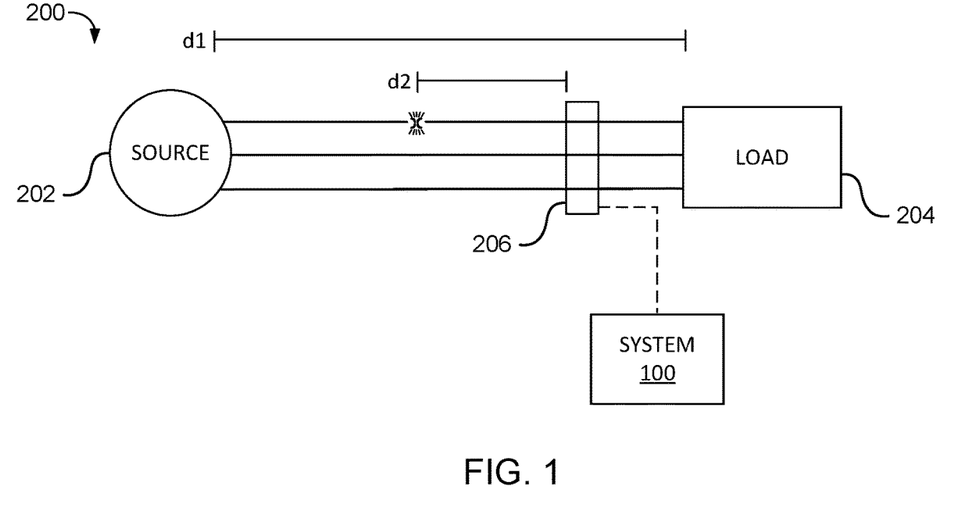
FIG. 1 illustrates a block diagram of an example embodiment of a system in connection with an electrical distribution system, according to some embodiments.

FIG. 1 illustrates a block diagram of an example system 100 in connection with an electrical distribution system 200, according to some embodiments.

The system 100 is in electrical connection with a measuring device 206 that monitors electrical current on one or more phases of the electrical distribution system 200. For example, as shown in FIG. 1, the electrical distribution system 200 is a three-wire AC power distribution system with each electrical conductor, e.g., phase AC signal, 120 degrees apart. The electrical distribution system 200 includes a source 202 and a load 204. In some embodiments, the measuring device 206 is located between the source 202 and the load 204. In some embodiments, the electrical distribution system 200 includes a plurality of the measuring device 206 distributed throughout the electrical distribution system 200. In some embodiments, the electrical distribution system 200 includes one or more other components, such as, for example, transformers, relays, substations, etc., and the measuring device 206 may be located at or near one of the other components in the electrical distribution system 200.

The system 100 obtains one or more phase current signals from measuring device 206, the one or more phase current signals corresponding to respective electrical conductors of electrical distribution system 200. In some embodiments, the 100//may be an HIF detector including one or more sensor, one or more processors, and one or more memory to enable the HIF detector to perform operations in accordance with the present disclosure. In some embodiments, the electrical distribution system 200 may be a three-wire AC distribution system. In some embodiments, the electrical distribution system 200 may be a single-wire system, two-wire system, three-wire system, four-wire system having a neutral/ground, other wiring configurations, or any combinations thereof. In this regard, the electrical current signals obtained from the measuring device 206 may be a multi-phase signal corresponding to one or more of the phases. In some embodiments, the electrical distribution system 200 may include more than three-wires, e.g., electrical conductors. In other embodiments, the electrical distribution system 200 may include less than three-wires. It is to be appreciated that the number of phases of the electrical distribution system 200 is not intended to be limiting and may include one or more phases in accordance with the present disclosure.

It can be appreciated that the system 100 can additionally possess one or more other components (e.g., computer-executable hardware or computer-executable software) as may be necessary to enable the system 100 to detect HIF faults in the electrical distribution system 200 and to enable the system 100 to implement any of a variety of communication protocols (e.g., infrared ("IR"), shortwave transmission, near-field communication ("NFC"), Bluetooth, Wi-Fi, long-term evolution ("LTE"), 3G, 4G, 5G, 6G, global system for mobile communications ("GSM"), code-division multiple access ("CDMA"), satellite, visual cues, radio waves, etc.) in accordance with this disclosure. The system 100 and/or various respective components can additionally comprise various graphical user interfaces (GUIs), input devices, or other suitable components. Those skilled in the art will appreciate that the system 100 may be a computerized tool that includes any suitable combination of computer-executable hardware and/or computer executable software which can be configured to perform various operations related to detecting HIFs in an electrical conductor of an electrical distribution system in accordance with this disclosure.

In various embodiments, the system 100 may be part of a network-based system. The system 100 may be in communicable connection with the electrical distribution system 200 and/or the measuring device 206 through the network to send and receive information corresponding to phase currents measured at the electrical conductor from one or more other computing devices also in communicable connection with the network.

In some embodiments, the system 100 may be any type of processor-based platforms that are connected to a network such as, without limitation, servers, personal computers, digital assistants, personal digital assistants, smart phones, pagers, digital tablets, laptop computers, Internet appliances, cloud-based processing platforms, and other processor-based devices either physical or virtual. In some embodiments, the system 100 may be specifically programmed with one or more application programs in accordance with one or more principles/methodologies detailed herein. In some embodiments, the system 100 may be specifically programmed with one or more models in accordance with one or more principles/methodologies detailed herein. In some embodiments, the system 100 may operate on any of a plurality of operating systems capable of supporting a browser or browser-enabled application, such as Microsoft™, Windows™, and/or Linux.

In some embodiments, the network based system including system 100 may also include and/or involve one or more cloud components. Cloud components may include one or more cloud services such as software applications (e.g., queue, etc.), one or more cloud platforms (e.g., a Web front-end, etc.), cloud infrastructure (e.g., virtual machines, etc.), and/or cloud storage (e.g., cloud databases, etc.). In some embodiments, the computer-based systems/platforms, computer-based devices, components, media, and/or the computer-implemented methods of the present disclosure may be specifically configured to operate in or with cloud computing/architecture such as, but not limiting to infrastructure a service (IaaS), platform as a service (PaaS), and/or software as a service (SaaS).

As used herein, the terms "computer engine" and "engine" identify at least one software component and/or a combination of at least one software component and at least one hardware component which are designed/programmed/configured to manage/control other software and/or hardware components (such as the libraries, software development kits (SDKs), objects, etc.).

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. In some embodiments, the one or more processors may be implemented as a Complex Instruction Set Computer (CISC) or Reduced Instruction Set Computer (RISC) processors; x86 instruction set compatible processors, multi-core, or any other microprocessor or central processing unit (CPU). In various implementations, the one or more processors may be dual-core processor(s), dual-core mobile processor(s), and so forth.

Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores," may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

In some embodiments, one or more of exemplary inventive computer-based systems/platforms, exemplary inventive computer-based devices, and/or exemplary inventive computer-based components of the present disclosure may include or be incorporated, partially or entirely into at least one personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

As used herein, the term "server" should be understood to refer to a service point which provides processing, database, and communication facilities. By way of example, and not limitation, the term "server" can refer to a single, physical processor with associated communications and data storage and database facilities, or it can refer to a networked or clustered complex of processors and associated network and storage devices, as well as operating software and one or more database systems and application software that support the services provided by the server. Cloud components and cloud servers are examples.

In some embodiments, as detailed herein, one or more of the computer-based systems of the present disclosure may obtain, manipulate, transfer, store, transform, generate, and/or output any digital object and/or data unit (e.g., from inside and/or outside of a particular application) that can be in any suitable form such as, without limitation, a file, a contact, a task, an email, a message, a map, an entire application (e.g., a calculator), data points, and other suitable data. In some embodiments, as detailed herein, one or more of the computer-based systems of the present disclosure may be implemented across one or more of various computer platforms such as, but not limited to: (1) Linux™, (2) Microsoft Windows™, (3) OS X (Mac OS), (4) Solaris™, (5) UNIX™ (6) VMWare™, (7) Android™, (8) Java Platforms™, (9) Open Web Platform, (10) Kubernetes or other suitable computer platforms. In some embodiments, illustrative computer-based systems or platforms of the present disclosure may be configured to utilize hardwired circuitry that may be used in place of or in combination with software instructions to implement features consistent with principles of the disclosure. Thus, implementations consistent with principles of the disclosure are not limited to any specific combination of hardware circuitry and software. For example, various embodiments may be embodied in many different ways as a software component such as, without limitation, a stand-alone software package, a combination of software packages, or it may be a software package incorporated as a "tool" in a larger software product.

For example, exemplary software specifically programmed in accordance with one or more principles of the present disclosure may be downloadable from a network, for example, a website, as a stand-alone product or as an add-in package for installation in an existing software application. For example, exemplary software specifically programmed in accordance with one or more principles of the present disclosure may also be available as a client-server software application, or as a web-enabled software application. For example, exemplary software specifically programmed in accordance with one or more principles of the present disclosure may also be embodied as a software package installed on a hardware device.

In some embodiments, exemplary inventive computer-based systems/platforms, exemplary inventive computer-based devices, and/or exemplary inventive computer-based components of the present disclosure may be configured to output to distinct, specifically programmed graphical interface implementations of the present disclosure (e.g., a desktop, a web app., etc.). In various implementations of the present disclosure, a final output may be displayed on a displaying screen which may be, without limitation, a screen of a computer, a screen of a mobile device, or the like. In various implementations, the display may be a holographic display. In various implementations, the display may be a transparent surface that may receive a visual projection. Such projections may convey various forms of information, images, and/or objects. For example, such projections may be a visual overlay for a mobile augmented reality (MAR) application.

In some embodiments, exemplary inventive computer-based systems/platforms, exemplary inventive computer-based devices, and/or exemplary inventive computer-based components of the present disclosure may be configured to be utilized in various applications which may include, but not limited to, gaming, mobile-device games, video chats, video conferences, live video streaming, video streaming and/or augmented reality applications, mobile-device messenger applications, and others similarly suitable computer-device applications.

In some embodiments, the exemplary inventive computer-based systems/platforms, the exemplary inventive computer-based devices, and/or the exemplary inventive computer-based components of the present disclosure may be configured to securely store and/or transmit data by utilizing one or more of encryption techniques (e.g., private/public key pair, Triple Data Encryption Standard (3DES), block cipher algorithms (e.g., IDEA, RC2, RC5, CAST and Skipjack), cryptographic hash algorithms (e.g., MD5, RIPEMD-160, RTRO, SHA-1, SHA-2, Tiger (TTH), WHIRLPOOL, RNGs).

The measuring device 206 monitors the electrical current at the electrical distribution system 200. In some embodiments, the measuring device 206 may be a current sensor. In other embodiments, the measuring device 206 may include a current sensor. In some embodiments, the measuring device 206 may be capable of monitoring for one or more electrical characteristics associated with the electrical distribution system 200 and the system 100 may obtain data from the measuring device 206 corresponding to the one or more electrical characteristics.

In some embodiments, the measuring device 206 may be capable of monitoring the electrical current for one or more phases (one or more electrical conductors) of the electrical distribution system 200. For example, the electrical distribution system 200 may be a three-wire/three-phase system and the measuring device 206 may be capable of monitoring the phase current for all three phases of electrical distribution system 200. In other embodiments, each electrical conductor, e.g., phase, of the electrical distribution system 200 may have a separate one of the measuring device 206 monitoring the respective electrical conductor. Additionally, in some embodiments, the system 100 may obtain the phase current signal(s) from measuring device 206 and the system 100 may be capable of performing the HIF detection for the respective electrical conductor based on the phase current signal(s). In some embodiments, the system 100 may include a plurality of computing devices, where the plurality of computing devices perform the HIF detection. For example, the system 100 may include a plurality of remotely located processing resources that may perform one or more portions of the HIF detection, in accordance with the present disclosure.

The measuring device 206 (e.g., current sensor) may be at a remote location from the location of the fault. For example, the HIF may occur at a transformer located 12 miles from the substation where the measuring device 206 is located. In some embodiments, the electrical distribution system 200 may span a distance d1 and the distance between the HIF location and the measuring device 206 may be a distance d2. In various embodiments, the location of the source of the HIF may be up to 15 miles from the location of the measuring device 206. In some embodiments, d2 may be up to 5 miles between the HIF and the measuring device 206. In some embodiments, d2 may be up to 10 miles between the HIF and the measuring device 206. In some embodiments, d2 may be up to 15 miles between the HIF and the measuring device 206. In other embodiments, the d2 may be greater than 15 miles between the source of the HIF and the measuring device 206.

In this regard, in some embodiments, the measuring device 206 may be capable of sending the measured signal data via wired or wireless connection implemented via any of a variety of communication protocols (e.g., infrared ("IR"), shortwave transmission, near-field communication ("NFC"), Bluetooth, Wi-Fi, long-term evolution ("LTE"), 3G, 4G, 5G, 6G, global system for mobile communications ("GSM"), code-division multiple access ("CDMA"), satellite, visual cues, radio waves, etc.) in accordance with this disclosure. The measuring device 206 and/or various respective components can additionally comprise various graphical user interfaces (GUIs), input/output devices, or other suitable components. Those skilled in the art will appreciate that the measuring device 206 may be a computerized tool that includes any suitable combination of computer-executable hardware and/or computer executable software which can be configured to perform various operations related to measuring electrical signals, e.g., voltage, resistance, current, other electrical signal data at an electrical conductor of an electrical distribution system 200 in accordance with this disclosure.

Figure 2:
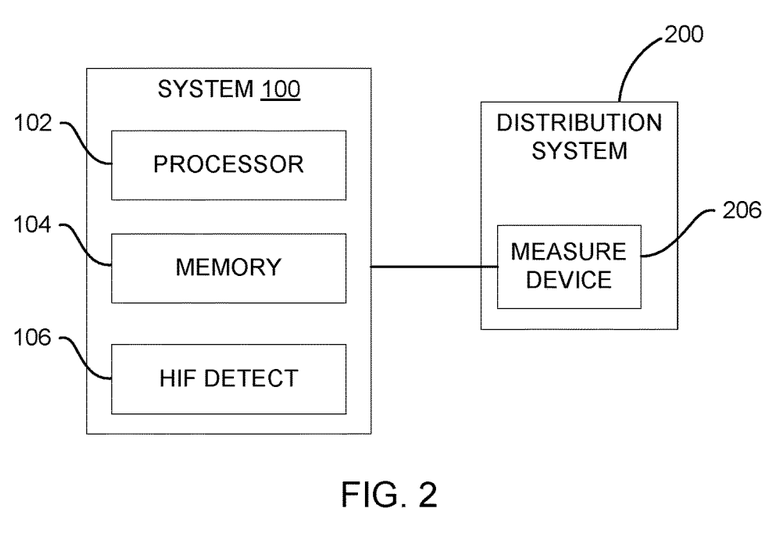
FIG. 2 illustrates a block diagram of the system of FIG. 1, according to some embodiments.

FIG. 2 illustrates a block diagram of the system 100 of FIG. 1, according to some embodiments.

The system 100 includes a processor 102, a memory 104, and an HIF detect 106. The memory 104 may be a non-transitory computer readable medium having stored thereon instructions that are executable by the processor 102 to cause the system 100 and the HIF detect 106 to perform one or more operations in accordance with this disclosure. The system 100 can be a computing device (e.g., including any suitable combination of computer-executable hardware and/or computer-executable software) for detecting the presence of HIFs at an electrical utility grid, such as electrical distribution system 200.

The system 100 includes a HIF detect 106. The HIF detect 106 includes instructions configured to obtain the signals from the measuring device 206 and determines the presence of a HIF in the electrical distribution system 200 based on performing the HIF detection. In this regard, the HIF detect 106 may apply one or more algorithmic functions to electrical signal data obtained from measuring device 206 to transform said data to instantaneous phases of windowed phase current signals such that the HIF detect 106 may calculate an error index for detecting the presence of an HIF in the electrical distribution system 200, as will be further described herein. In this regard, in some embodiments, the system 100 is capable of active continuous monitoring of phase current signals to perform real-time detection of HIFs in the electrical distribution system 200.

The system 100 is in electrical communicable connection with the measuring device 206 as the electrical characteristics of the one or more electrical conductors of the electrical distribution system 200 are monitored by the measuring device 206. In some embodiments, the measuring device 206 may be part of the system 100. In other embodiments, and as shown in FIG. 2, the measuring device 206 may be part of electrical distribution system 200 and the system 100 may be in electrical communication with the measuring device 206 to obtain one or more phase current signals from the measuring device 206.

Additionally, in some embodiments, the system 100 may be locally connected to the measuring device 206. For example, the system 100 may be in the same location as the measuring device 206 and the measuring device 206 may be physically connected to the system 100 via an electrical cable connecting the measuring device 206 to an interface (not shown) on the system 100. In other embodiments, the system 100 may be remotely located from the measuring device 206. In this regard, the system 100 may be remotely located relative to the location of the measuring device 206. For example, the measuring device 206 may be located at a transformer and the system 100 may be located at an electrical distribution control center.

In some embodiments, the system 100 may be a computing device including hardware and software components for obtaining the phase current signals from the measuring device 206 and performing the HIF detection based on the obtained signals. In other embodiments, the system 100 may be a virtual machine including one or more processors 102 and one or more memory 104 on a server-based network capable of performing the HIF detection based on the signal(s) obtained from the measuring device 206. In some embodiments, the system 100 may be part of the electrical distribution system 200. In other embodiments, the system 100 may be external to the electrical distribution system 200 but in electrically communicable connection with the electrical distribution system 200 and the measuring device 206 such as through a server or the cloud.

In some embodiments, the electrical distribution system 200 may include one or more substations (not shown) distributed throughout the electrical distribution system 200. In some embodiments, the system 100 and/or the measuring device 206 may be part of one of the substations. As such, in some embodiments, the HIF may occur at the substation or may occur at a location remote from the substation, but the HIF may be measured at the substation by the measuring device 206 and identified as an HIF by the system 100. In some embodiments, each substation may include the system 100. In other embodiments, the system 100 may be remotely located from the measuring device 206 and the system 100 may be in electrical communicable connection with the measuring device 206 where the phase current signal indicative of the fault is measured. In other embodiments, the system 100 may be in connection with a plurality of substations in the electrical distribution system 200 for performing the HIF detection in the electrical distribution system 200.

The system 100 may include a measuring device 206. The measuring device 206 measures for one or more electrical parameters in an electrical conductor of the electrical distribution system 200. For example, the measuring device 206 may be a multi-function sensor capable of detecting one or more electrical parameters such as voltage and current at an electrical conductor. The system 100 utilizes the obtained data corresponding to electrical current at the electrical conductor to enable the system 100 to provide real-time HIF detection based on the phase current signal obtained from the system 100. In this regard, in some embodiments, the measuring device 206 may continuously monitor for the parameter in the electrical distribution system 200 and the system 100 may continuously obtain the data and process the data in real-time. In other embodiments, the system 100 may be configured to obtain the data from the measuring device 206 and stores the incoming data in the memory 104 prior to retrieving the data from the memory 104 for processing to detect HIF.

In some embodiments, the measuring device 206 may only measure for one parameter at the electrical conductor. In other embodiments, the measuring device 206 may measure for one or more parameters and the system 100 may filter the data obtained from the measuring device 206 to extract the relevant data corresponding to the phase current signals. In some embodiments, the measuring device 206 may measure the electrical current at the electrical conductor. In some embodiments, the measuring device 206 may measure the current for one of the three phases of the electrical conductor. In some embodiments, the measuring device 206 may be capable of measuring the phase current for more than one phase of the 3-phase electrical conductor. The system 100 obtains the data corresponding to the phase current from the measuring device 206 to perform the HIF detection analysis on the obtained signal data in accordance with this disclosure.

In some embodiments, the measuring device 206 may include one or more sensors, each sensor monitoring a particular electrical parameter of the electrical conductor. In other embodiments, the measuring device 206 may be one or more sensors, each sensor monitoring a particular phase of the electrical distribution system 200 and each sensor monitoring one or more electrical parameters at the respective phase. For example, the electrical distribution system 200 may include three phases and a sensor may be attached to each phase of the three phases for monitoring the electrical parameters for each respective phase.

The system 100 is in electrically communicable connection with the measuring device 206 to obtain the signal data. Additionally, the electrical distribution system 200 may include the measuring device 206 for monitoring the current and/or other parameters at the electrical conductor. In some embodiments, the measuring device 206 may be located in one of the substations, or between one of the substations, of the electrical distribution system 200.

Figure 3:
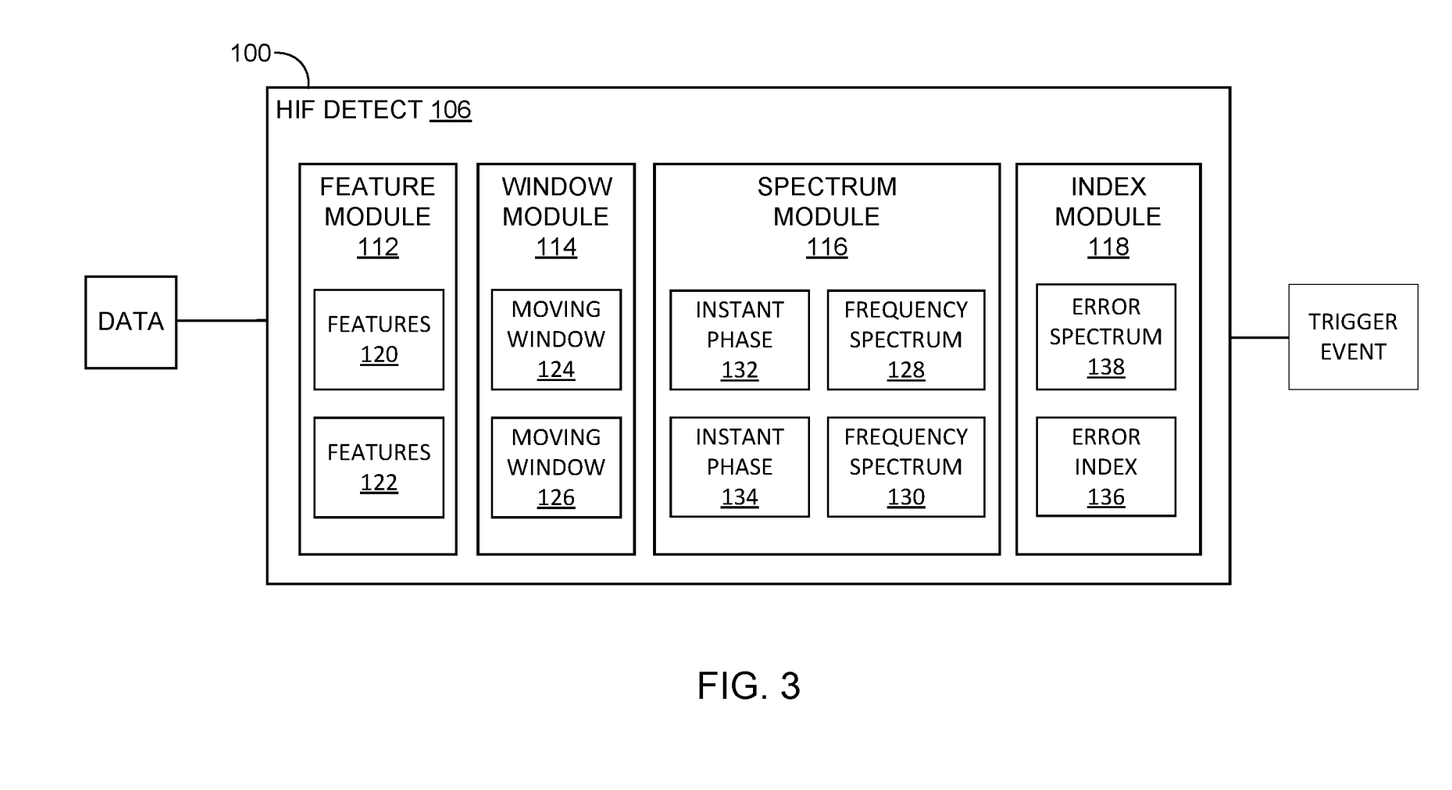
FIG. 3 illustrates a block diagram of the system, according to some embodiments.

FIG. 3 illustrates a block diagram of the system 100, according to some embodiments.

The system 100 includes the HIF detect 106. As the signal(s) corresponding to the electrical distribution system 200, and measured by the measuring device 206, are obtained by the system 100, the HIF detect 106 performs an HIF detection on at least one of the phases of the multi-phase signal. In this regard, the HIF detect 106 includes a window module 114, a spectrum module 116, and an index module 118. The signals obtained from the measuring device 206 correspond to an original phase current signal of at least one of the phases of the electrical distribution system 200. The HIF detect 106 may also be configured to generate a second phase current signal based on the first current signal, as will be further described herein. The HIF detect 106 generates the second current signal to enable the system 100 and the HIF detect 106 to perform the HIF detection, as will be further described herein. Additionally, the phase current signal obtained from the measuring device 206 will be hereinafter referred to as a first current signal and the generated second phase current signal will be hereinafter referred to as a second current signal.

The system 100 includes the feature module 112. The feature module 112 performs a feature extraction on the first current signal. In some embodiments, the feature module 112 may also perform a feature extraction on the second current signal. The second current signal is generated based on the first current signal. In some embodiments, the HIF detect 106 and the feature module 112 may generate the second current signal based on one or more features extracted from the first current signal. In this regard, in some embodiments, the second current signal may have a similar frequency, length, and phase as the first current signal. In some embodiments, the second current signal may be a sinusoidal wave signal. In other embodiments, the second current signal may be a pure sinusoidal wave signal.

The HIF detect 106 includes the window module 114. The window module 114 defines a moving window for each of the phase current signal. The moving window being defined as a certain length (e.g., cycles) of the phase current signal. The length of the moving window thereby defines a certain time domain of the phase current signal based on a grid operating frequency. In this regard, the system 100 and the HIF detect 106 is configured to continuously monitor for HIFs by performing the HIF detection on a portion of the phase current signal during the moving window. In some embodiments, a length of the moving window, e.g., time domain, may be a predetermined length determined based on the grid operating frequency. For example, the signal length may be defined by a user and provided as input into the system 100. In some embodiments, the moving window may be defined based on the extracted features from the first current signal. For example, a length of the moving window may be based on the frequency of the first current signal and the grid operating frequency of the electrical distribution system 200. In some embodiments, the moving window may be defined to correspond to 1 cycle of the phase current signal. For example, a phase current signal can have a frequency (fs)=4800 Hz and 1 cycle of the moving window can be defined as having a signal length of fs/60=80 points equivalent to 16 ms, where the signal length is dependent on the grid operating frequency at which the electrical distribution system 200 is configured to operate. Accordingly, for systems that operate at 60 Hz, the signal length may be determined by dividing the frequency by 60 Hz. However, for systems that operate at 50 Hz, the signal length may be determined by dividing the frequency by 50 Hz. In other embodiments, the moving window may correspond to a length that is equal to, greater than, or less than 1 cycle.

The window module 114 defines a first moving window 124 for the first current signal. Additionally, the window module 114 also defines a second moving window 126 for the second current signal. In this regard, the feature module 112 may extract a first set of features 120 from the first current signal and the first moving window 124 may be defined based on the first set of features 120. Additionally, in some embodiments, the feature module 112 may determine a second set of features 122 from the second current signal and the second moving window 126 may be defined based on the second set of features 122. In some embodiments, the second moving window 126 may also be defined on the second current signal based on the first moving window 124. In this regard, a position and length of the second moving window 126 may be defined based on the position and length of the first moving window 124 on the first current signal. Accordingly, the position and length defining the second moving window 126 may be identical to the first moving window 124 to enable the HIF detect 106 and the system 100 to perform the HIF detection, as will be further described herein.

The system 100 includes the spectrum module 116. The spectrum module 116 transforms the first current signal to a first frequency spectrum 128 and the second current signal to a second frequency spectrum 130. The spectrum module 116 transforms the respective windowed first current signal and windowed second current signals to respective instantaneous phase to enable the system 100 to determine the first frequency spectrum 128 and second frequency spectrum 130 corresponding to the respective windowed first current signal and second current signal.

Accordingly, the spectrum module 116 calculates a first instantaneous phase 132 from the first moving window 124 and a second instantaneous phase 134 from the second moving window 126. The first instantaneous phase 132 and second instantaneous phase 134 are calculated by applying a first transform function to the first moving window 124 and first moving window 124 respectively. In some embodiments, the first transform function may be a Hilbert transform. For example, in some embodiments, the Hilbert transform may be defined as:

$$H(x) = \hat{x}(t) := x(t) * \frac{1}{\pi t}, A(t) := \sqrt{x(t)^2 + \hat{x}(t)^2}, \varphi(t) := \tan^{-1}\frac{\hat{x}(t)}{x(t)},$$

where A(t) is an instantaneous amplitude and φ(t) is an instantaneous phase.

The spectrum module 116 produces a frequency spectrum dataset by applying a second transform function to the instantaneous phase of the first moving window 124 and second moving window 126. In this regard, the spectrum module 116 determines a first frequency spectrum 128 based on applying the second transform function to the first instantaneous phase 132 and the spectrum module 116 determines the second frequency spectrum 130 based on applying the second transform function to the second instantaneous phase 134. The spectrum module 116 performs a transform function on the first moving window 124 of the first instantaneous phase 132 and the second moving window 126 of the second instantaneous phase 134 respectively. In some embodiments, the second transform function may be a Fourier transform function. Additionally, the resolution for the first frequency spectrum 128 and second frequency spectrum 130 may be based on the length of the first moving window 124 and second moving window 126 respectively. For example, in the instance where the sampling frequency is 4800 Hz, the frequency spectrum may include frequencies from 0 to fs/2=2400 Hz with resolution of fs/80=60 Hz.

In some embodiments, calculating the frequency spectrum may include shifting the instantaneous phases of the respective first moving window 124 and second moving window 126. In this regard, in some embodiments, the spectrum module 116 may shift the phase of the input frequencies components by −π/2, i.e., where:

$$\hat{X}(\omega) = -j\text{sgn}(\omega)X(\omega)$$
$$x(t) = \cos\omega t$$
$$\hat{x}(t) = \sin\omega t$$

-continued
$$A(t) = \sqrt{x(t)^2 + \hat{x}(t)^2} = 1$$
$$\varphi(t) := \tan^{-1}\frac{\hat{x}(t)}{x(t)} = \omega t.$$

It is to be appreciated by those having ordinary skill in the art that the instantaneous phase is not sensitive to the signal amplitude. Therefore, for a pure sinusoidal function, the instantaneous amplitude is always 1 and the instantaneous phase is a linear function respect to time that moves from −π to π radian with the slope of ω.

The system 100 includes the index module 118. The index module 118 calculates an error index 136 at the respective phase of the electrical distribution system 200 based on the first frequency spectrum 128 and second frequency spectrum 130 determined by the HIF detect 106 and the spectrum module 116. The error index 136 being a value corresponding to a sum of the differences between the points of the first frequency spectrum 128 and the points of the second frequency spectrum 130. In some embodiments, the points of the first frequency spectrum 128 and second frequency spectrum 130, respectively, may form a dataset comprising one or more matched pairs, each matched pair having a point from the first frequency spectrum 128 and second frequency spectrum 130 respectively.

Determining the error index 136 may include determining, by the index module 118, an error spectrum 138. The error spectrum 138 may be a dataset having one or more values indicative of a difference between the corresponding matched pairs. Accordingly, the index module 118 may obtain a dataset including the one or more matched pairs associated with the first frequency spectrum 128 and second frequency spectrum 130 and the index module 118 may produce a dataset comprising one or more values indicative of the error spectrum 138 based on calculating the difference between the data points in each matched pair.

In some embodiments, the index module 118 may determine the error index 136 based on the error spectrum 138. In this regard, the error index 136 may be an index value indicative of a sum of the error spectrum 138. As such, the error spectrum 138 includes one or more values corresponding to a difference between the one or more matched pairs and the error index 136 may be the sum of these values.

In some embodiments, the index module 118 may also perform a smoothing operation to the error index 136. To perform the smoothing operation, the index module 118 applies a moving average of a certain length to the error index 136. In some embodiments, the index module 118 may apply a moving median with a window length of a certain length. For example, the smoothing operation may include applying a moving average with a window length of 5 lengths.

The HIF detect 106 performs the HIF detection based on the error index 136. In this regard, the HIF detect 106 detects a HIF at the phase corresponding to the first current signal when the error index 136 exceeds an error index of one of the other phases of the multi-phase signal by a reference threshold. For example, in some embodiments, the electrical distribution system 200 may include three phases, e.g., three electrical conductors, and the system 100 detects a HIF at one of the three phases based on the error index 136 for the one phase being greater than the error index of the other phases by a reference threshold. Accordingly, the system 100 applies the one or more modules to the phase current signal of each phase and determine the presence of an HIF based on the error index 136 calculated for each phase and based on a comparison between the error index 136 associated with each phase in the electrical distribution system 200. In some embodiments, the HIF may be detected when the HIF index for a particular phase is greater than the HIF index of the other phases. In other embodiments, the HIF may be detected when the HIF index exceeds the value of the index of the other phases by a predefined threshold. In some embodiments, the HIF may be detected when the HIF index for a particular phase exceeds the value of the HIF index of at least one of the other phases by a predefined threshold.

In some embodiments, the system 100 and/or the HIF detect 106 may adaptively determine the reference threshold that identifies the occurrence of the trigger event (e.g., HIF). In this regard, in some embodiments, the reference threshold may be a parameter that is to be adaptively calculated based on the other phases of the multi-phase signal that are not experiencing the HIF, e.g., trigger event. The training of the reference threshold being based on the other phases of the multi-phase signal thereby establishes a sensitivity for the system 100. Accordingly, the HIF detect 106 detects for HIFs at the electrical distribution system 200 such that whether a trigger event is occurring is uniquely determined based on the measured electrical characteristics of the multi-phase signal obtained from the respective electrical distribution system, such as electrical distribution system 200 as shown in FIG. 1. However, different electrical distribution systems may have different or unique signal characteristics compared to other electrical distribution systems. Additionally, the signals measured by a particular measuring device in one part of an electrical distribution system may have different or unique electrical characteristics compared to the signals measured by a different measuring device in another part of the electrical distribution system during the same time domain based on any of a plurality of factors affecting the electrical signals measured at each respective measuring device. In this regard, the system 100 may be capable of being installed into an electrical distribution system such as electrical distribution system 200 as shown in FIG. 1 and determining the occurrence of an HIF in the electrical distribution system 200 and a respective phase without having to train the system 100 using reference data and/or historical data.

In some embodiments, the system 100 may determine an HIF when a certain number of HIF indices (length) exceeds the threshold. In some embodiments, the HIF detection may be based on a certain number of consecutive HIF indices exceeding the threshold. For example, the system 100 detects the presence of an HIF when 5 consecutive HIF indices exceeds the threshold. By increasing the number of HIF indices that exceed the threshold before determining the presence of an HIF, the reliability is thereby increased and the false positive rate is decreased.

The system 100 is capable of detecting HIFs based on the electrical conductor coming into contact with a plurality of different surfaces. In some embodiments, the surface may include wet sand, tree branches, dry sod, dry grass, wet sod, wet grass, concrete, reinforced concrete, other materials, or any combinations thereof. Additionally, the system 100 is capable of detecting HIF for a plurality of different loads. In some embodiments, the different loads may include a P-Q load, P-Q load with synchronous motor, nonlinear load (e.g., solar farm, arc furnace, etc.), or any combinations thereof. The system 100 may also be capable of detecting HIF in a plurality of different scenarios. In some embodiments, the different scenarios may include capacitor bank switching, transformer switching, reclose switching, non-linear load switching, grounding systems, max range for HIF detection, or any combinations thereof. The system 100 may be capable of HIF detection within 15 miles from the location (e.g., substation) where the signal are captured corresponding to the phase current signals.

In some embodiments, the system 100 may perform a classification of the HIF indices. The classification may include applying a metric to reduce an occurrence of false positive HIF detection. The classification may also include applying the metric to reduce the occurrence of missed HIF detection. In some embodiments, to reduce an error probability, the system 100 may hold one error probability constant while minimizing the other error probability. By minimizing the other error probability, the optimal threshold for the initial error probability may be determined.

In some embodiments, the system 100 may be configured to optimize HIF detection based on a confusion matrix. The metrics may include a true positive rate, true negative rate, positive predictive value, negative predictive value, and geometric mean. The confusion matrix is shown by the following table:

| | Positive | Negative | |
|---|---|---|---|
| Positive | True Positive (TP) | False Negative (FN) Type II Error | Sensitivity $\frac{TP}{(TP+FN)}$ |
| Negative | False Positive (FP) Type I Error | True Negative (TN) | Specificity $\frac{TN}{(TN+FP)}$ |
| | Precision $\frac{TP}{(TP+FP)}$ | Negative Predictive Value $\frac{TN}{(TN+FN)}$ | Accuracy $\frac{TP+TN}{(TP+TN+FP+FN)}$ |

As used herein, the term "impedance" is a measure of the response of an electric circuit to an alternating current. The current is opposed by the capacitance and inductance of the circuit in addition to the resistance.

Figure 4:
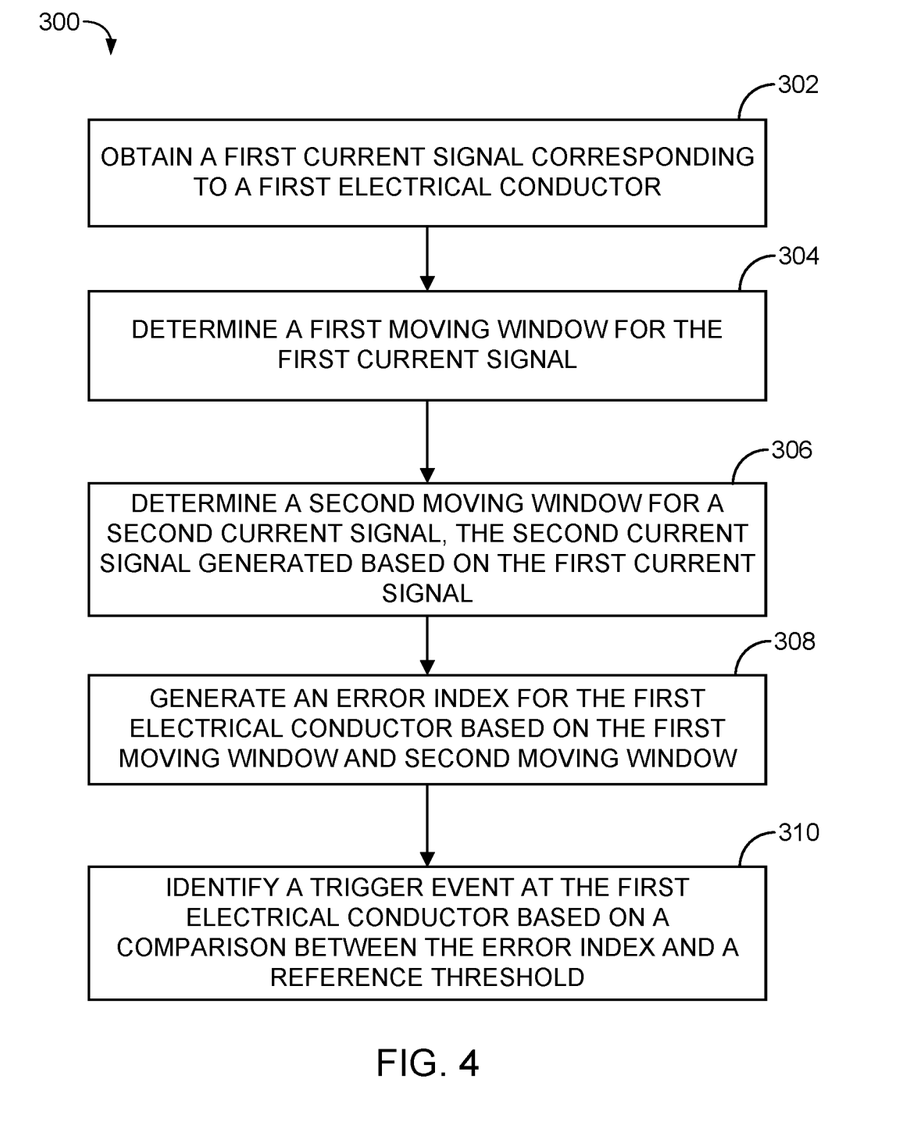
FIGS. 4-6 illustrate flow diagrams of method 300, according to some embodiments.
Figure 5:
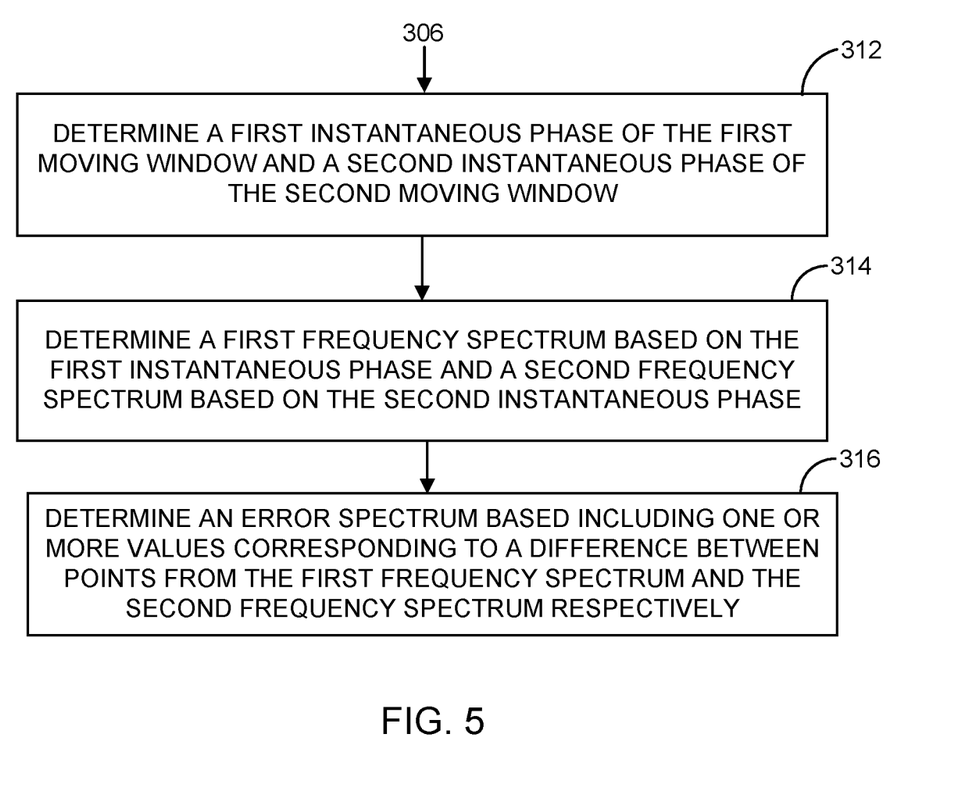
Figure 6:
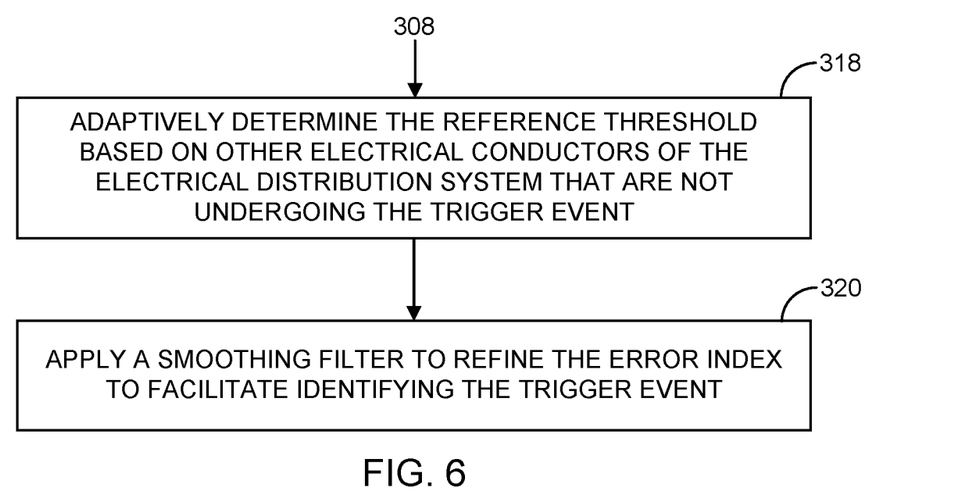

FIGS. 4-6 illustrate flow diagrams of method 300, according to some embodiments. FIGS. 4-6 will be described collectively unless specifically referenced otherwise.

Referring to FIG. 4, at 302, the method includes obtaining a first current signal corresponding to a first electrical conductor of an electrical distribution system 200. In some embodiments, the electrical distribution system 200 includes more than one electrical conductor corresponding to a multi-phase system. In this regard, in some embodiments, the electrical distribution system 200 includes the first electrical conductor and at least one additional electrical conductor. In some embodiments, the phase current signals may be obtained by a measuring device 206 monitoring the one or more phases of the electrical distribution system 200. In some embodiments, the electrical distribution system 200 may include two, three, four, or more electrical conductors, in accordance with the present disclosure.

At 304, the method 300 includes determining, based on a time period, a first moving window 124 for the first current signal. In some embodiments, the first current signal includes a frequency and a phase. In some embodiments, the first moving window 124 is defined based on a signal length.

At 306, the method 300 includes determining, based on the time period, a second moving window 126 for a second current signal, the second current signal being generated based on the first current signal. In some embodiments, the second current signal comprises a pure sinusoidal wave signal, the second current signal having a frequency and phase matching the first current signal. In some embodiments, the second moving window 126 includes a same signal length as the first moving window 124. In some embodiments, the signal length may be at least one cycle of the first and second current signals.

At 308, the method 300 includes generating an error index 136 for the first electrical conductor based on first moving window 124 and the second moving window 126. The error index 136 is indicative of a trigger event at the first electrical conductor of the electrical distribution system 200.

Reffering to FIG. 5, in some embodiments, at 312, the method 300 further includes determining a first instantaneous phase 132 of the first moving window 124 and a second instantaneous phase 134 of the second moving window 126. The first instantaneous phase 132 is determined for the first moving window 124 of the first current signal based on applying a first transform function to the portion of the first current signal defined by the first moving window 124. The second instantaneous phase 134 is determined for the second moving window 126 of the second current signal based on applying the first transform function to the portion of the second current signal defined by the second moving window 126. In this regard, in some embodiments, the first instantaneous phase 132 and second instantaneous phase 134 are calculated by applying a first transform function to the windowed first current signal and windowed second current signal, respectively.

In some embodiments, at 314, the method 300 further includes determining a first frequency spectrum 128 based on the first instantaneous phase 132 and a second frequency spectrum 130 based on the second instantaneous phase 134. In some embodiments, the first frequency spectrum 128 and the second frequency spectrum 130 include spectral data points transformed form the instantaneous phases of the windowed respective first current signal and second current signal. In some embodiments, the first frequency spectrum 128 and the second frequency spectrum 130 comprise spectral data transformed from the first instantaneous phase 132 of the first moving window 124 and the second instantaneous phase 134 of the second moving window 126. In this regard, the first frequency spectrum 128 is determined by applying a second transform function to the first instantaneous phase 132 to produce a first set of points corresponding to the first moving window 124 of the first current signal. Additionally, the second frequency spectrum 130 is determined by applying the second transform function to the second instantaneous phase 134 to produce a second set of points corresponding to the second moving window 126 of the second current signal. As such, in some embodiments, the first frequency spectrum 128 and the second frequency spectrum 130 may be based on transforming the instantaneous phases determined from the moving window of the respective first current signal and the second current signal.

In some embodiments, at 316, the method 300 further includes determining an error spectrum 138 including one or more values corresponding to a difference between points from the first frequency spectrum 128 and the second frequency spectrum 130 respectively. Additionally, in some embodiments, the error index 136 is a sum of the one or more values corresponding to the error spectrum 138. In some embodiments, determining the error index 136 includes applying a moving average to the error index 136.

Referring again to FIG. 4, at 310, the method 300 includes identifying a trigger event for the first electrical conductor based on a comparison between the error index 136 and a reference threshold. In some embodiments, the trigger event comprises a high impedance fault (HIF) at the first electrical conductor of the electrical distribution system 200. In some embodiments, the trigger event comprises an HIF on the first electrical conductor of the electrical distribution system 200 determined based on a comparison to an error index at one of the other electrical conductors of the electrical distribution system 200. In some embodiments, the HIF may occur at more than one electrical conductor of the electrical distribution system 200.

Referring to FIG. 6, in some embodiments at 318, the method 300 includes adaptively determining the reference threshold based on the other phases of the electrical distribution system 200 that are not undergoing the trigger event. In some embodiments, the reference threshold comprises a parameter defining a sensitivity of detecting the trigger event. Accordingly, in some embodiments, the reference threshold may be trained based on the error index at one or more other electrical conductors of the electrical distribution system 200.

In some embodiments, at 320, the method 300 includes applying a smoothing filter to refine the error index 136 to facilitate identifying the trigger event. In some embodiments, the method 300 includes identifying a trigger event when the error index 136 exceeds the reference threshold for a certain number of indices. For example, the trigger event may be detected when the error index 136 exceeds the reference index for 5 consecutive indices.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "windowing" refers to the tapering of a sampled signal prior to a transformation being applied in order to reduce the effect of any discontinuities at the edges. This may be achieved by multiplying the portion of the time domain signal to be transformed by a window function, which is equivalent to the value of the output of an integral at a given time t in the frequency domain.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

Aspects

Various Aspects are described below. It is to be understood that any one or more of the features recited in the following Aspect(s) can be combined with any one or more other Aspect(s).

Aspect 1. A method comprising: obtaining, by a computing device, a first current signal corresponding to a first electrical conductor of an electrical distribution system; determining, by the computing device, based on a time period, a first moving window for the first current signal; determining, by the computing device, based on the time period, a second moving window for a second current signal, the second current signal being generated based on the first current signal; generating, by the computing device, an error index for the first electrical conductor based on the first moving window and the second moving window; and identifying, by the computing device, a trigger event at the first electrical conductor based on a comparison between the error index and a reference threshold.

Aspect 2. The method according to aspect 1, wherein the electrical distribution system comprises more than one electrical conductor corresponding to a multi-phase system.

Aspect 3. The method according to any of the preceding aspects, wherein the second current signal comprises a pure sinusoidal wave signal generated based on the first current signal, the second current signal having a same length and phase as the first current signal.

Aspect 4. The method according to any of the preceding aspects, further comprising: determining, by the computing device, a first instantaneous phase of the first moving window and a second instantaneous phase of the second moving window; and determining, by the computing device, a first frequency spectrum based on the first instantaneous phase and a second frequency spectrum based on the second instantaneous phase.

Aspect 5. The method according to aspect 4, wherein the first frequency spectrum and the second frequency spectrum comprise spectral data transformed from the first instantaneous phase of the first moving window and the second instantaneous phase of the second moving window.

Aspect 6. The method according to aspect 4 or 5, further comprising: determining, by the computing device, an error spectrum comprising one or more values corresponding to a difference between points from the first frequency spectrum and the second frequency spectrum respectively, wherein the error index comprises a sum of the error spectrum.

Aspect 7. The method according to any of the preceding aspects, wherein the first current signal comprises: a frequency, and a phase; wherein the first moving window is defined based on a signal length.

Aspect 8. The method according to aspect 7, wherein the second current signal further comprises the frequency and phase of the first current signal and the second moving window comprises a same signal length as the first moving window.

Aspect 9. The method according to aspect 7 or 8, wherein the signal length comprises at least one cycle of the first current signal and second current signal.

Aspect 10. The method according to any of the preceding aspects, further comprising: adaptively determining, by the computing device, the reference threshold based on the other electrical conductors of the electrical distribution system that are not undergoing the trigger event, wherein the reference threshold comprises a parameter defining a sensitivity of detecting the trigger event.

Aspect 11. The method according to any of the preceding aspects, further comprising: applying, by the computing device, a smoothing filter to refine the error index to facilitate identifying the trigger event.

Aspect 12. The method according to any of the preceding aspects, wherein the trigger event comprises a high impedance fault (HIF).

Aspect 13. A system comprising: a current sensor; a processor; and one or more non-transitory computer readable medium having stored thereon instructions that are executable by the processor to enable the system to perform operations comprising: obtain a first current signal corresponding to a first electrical conductor of an electrical distribution system; determine, based on a time period, a first moving window for the first current signal; determine, based on the time period, a second moving window for a second current signal, the second current signal being generated based on the first current signal, wherein the second current signal comprises a pure sinusoidal wave signal generated based on the first current signal, the second current signal having a same length and phase as the first current signal; determine a first frequency spectrum based on the first moving window and a second frequency spectrum based on the second moving window; generate an error index for the first electrical conductor based on first moving window and the second moving window; and identify a trigger event for the first electrical conductor based on a comparison between the error index and a reference threshold.

Aspect 14. The system according to aspect 13, wherein the system further performs operations comprising: determine a first instantaneous phase of the first moving window and a second instantaneous phase of the second moving window, wherein the first frequency spectrum and the second frequency spectrum comprise spectral data transformed from the first instantaneous phase of the first moving window and a second instantaneous phase of the second moving window respectively; and determine an error spectrum comprising one or more values corresponding to a difference between points from the respective first frequency spectrum and the second frequency spectrum, wherein the error index comprises a sum of the error spectrum.

Aspect 15. The system according to aspect 13 or 14, wherein the system further performs operations comprising: adaptively determine the reference threshold based on the other electrical conductors of the electrical distribution system that are not undergoing the trigger event, wherein the reference threshold comprises a parameter defining a sensitivity of detecting the trigger event.

Aspect 16. The system according to aspect 13, 14, or 15, wherein the first current signal comprises: a frequency, and a phase; wherein the first moving window is defined based on a signal length; and wherein the second current signal further comprises the frequency and phase of the first current signal and the second moving window comprises a same signal length as the first moving window.

Aspect 17. The system according to aspect 13, 14, 15, or 16, wherein the trigger event comprises a high impedance fault (HIF).

Aspect 18. An electrical distribution system comprising: an HIF detector comprising: one or more sensors, a processor, and a non-transitory computer readable medium having stored thereon instructions that are executable by the processor to enable the HIF detector to perform operations comprising: obtain a first current signal corresponding to a first electrical conductor of an electrical distribution system, determine, based on a time period, a first moving window for the first current signal, determine, based on the time period, a second moving window for a second current signal, the second current signal being generated based on the first current signal, determine a first instantaneous phase of the first moving window and a second instantaneous phase of the second moving window, determine a first frequency spectrum based on first instantaneous phase and the first moving window and a second frequency spectrum based on the second instantaneous phase and the second moving window, determine an error spectrum comprising one or more values corresponding to a difference between points from the first frequency spectrum and the second frequency spectrum respectively, generate an error index for the first electrical conductor based on first moving window and the second moving window; and identify a trigger event for the first electrical conductor based on a comparison between the error index and a reference threshold.

Aspect 19. The electrical distribution system according to aspect 18, wherein the second current signal comprises a pure sinusoidal wave signal generated based on the first current signal, the second current signal having a same length and phase as the first current signal; wherein the first current signal comprises: a frequency, and a phase; wherein the first moving window is defined based on a signal length; and wherein the second current signal further comprises the frequency and phase of the first current signal and the second moving window comprises a same signal length as the first moving window.

Aspect 20. The electrical distribution system according to aspect 18 or 19, wherein the HIF detector further performs operations comprising: adaptively determine the reference threshold based on the other electrical conductors of the electrical distribution system that are not undergoing the trigger event, wherein the reference threshold comprises a parameter defining a sensitivity of detecting the trigger event.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A method comprising:
   obtaining, by a computing device, a first current signal corresponding to a first electrical conductor of an electrical distribution system;
   determining, by the computing device, based on a time period, a first moving window for the first current signal;
   determining, by the computing device, based on the time period, a second moving window for a second current signal, the second current signal being generated based on the first current signal;
   determining a first frequency spectrum based on the first moving window and a second frequency spectrum based on the second moving window;
   generating, by the computing device, an error index for the first electrical conductor based on the first frequency spectrum and the second frequency spectrum; and
   identifying, by the computing device, a trigger event at the first electrical conductor based on a comparison between the error index and a reference threshold.

2. The method of claim 1, wherein the electrical distribution system comprises more than one electrical conductor corresponding to a multi-phase system.

3. The method of claim 1, wherein the second current signal comprises a pure sinusoidal wave signal generated based on the first current signal, the second current signal having a same length and phase as the first current signal.

4. The method of claim 1, further comprising:
   determining, by the computing device, a first instantaneous phase of the first moving window and a second instantaneous phase of the second moving window; and
   determining, by the computing device, the first frequency spectrum based on the first instantaneous phase and the second frequency spectrum based on the second instantaneous phase.

5. The method of claim 4, wherein the first frequency spectrum and the second frequency spectrum comprise spectral data transformed from the first instantaneous phase of the first moving window and the second instantaneous phase of the second moving window.

6. The method of claim 4, further comprising:
   determining, by the computing device, an error spectrum comprising one or more values corresponding to a difference between points from the first frequency spectrum and the second frequency spectrum respectively,
   wherein the error index comprises a sum of the error spectrum.

7. The method of claim 1, wherein the first current signal comprises:
   a frequency, and
   a phase;
   wherein the first moving window is defined based on a signal length.

8. The method of claim 7, wherein the second current signal further comprises the frequency and the phase of the first current signal and the second moving window comprises a same signal length as the first moving window.

9. The method of claim 7, wherein the signal length comprises at least one cycle of the first current signal and the second current signal.

10. The method of claim 1, further comprising:
    adaptively determining, by the computing device, the reference threshold based on the other electrical conductors of the electrical distribution system that are not undergoing the trigger event,
wherein the reference threshold comprises a parameter defining a sensitivity of detecting the trigger event.

11. The method of claim 1, further comprising:
applying, by the computing device, a smoothing filter to refine the error index to facilitate identifying the trigger event.

12. The method of claim 1, wherein the trigger event comprises a high impedance fault (HIF).

13. A system comprising:
a current sensor;
a processor; and
one or more non-transitory computer readable medium having stored thereon instructions that are executable by the processor to enable the system to perform operations comprising:
obtain a first current signal corresponding to a first electrical conductor of an electrical distribution system;
determine, based on a time period, a first moving window for the first current signal;
determine, based on the time period, a second moving window for a second current signal, the second current signal being generated based on the first current signal,
wherein the second current signal comprises a pure sinusoidal wave signal generated based on the first current signal, the second current signal having a same length and phase as the first current signal;
determine a first frequency spectrum based on the first moving window and a second frequency spectrum based on the second moving window;
generate an error index for the first electrical conductor based on the first moving window and the second moving window; and
identify a trigger event for the first electrical conductor based on a comparison between the error index and a reference threshold.

14. The system of claim 13, wherein the system further performs operations comprising:
determine a first instantaneous phase of the first moving window and a second instantaneous phase of the second moving window,
wherein the first frequency spectrum and the second frequency spectrum comprise spectral data transformed from the first instantaneous phase of the first moving window and the second instantaneous phase of the second moving window respectively; and
determine an error spectrum comprising one or more values corresponding to a difference between points from the respective first frequency spectrum and the second frequency spectrum,
wherein the error index comprises a sum of the error spectrum.

15. The system of claim 13, wherein the system further performs operations comprising:
adaptively determine the reference threshold based on the other electrical conductors of the electrical distribution system that are not undergoing the trigger event,
wherein the reference threshold comprises a parameter defining a sensitivity of detecting the trigger event.

16. The system of claim 13, wherein the first current signal comprises:
a frequency, and
a phase;
wherein the first moving window is defined based on a signal length; and
wherein the second current signal further comprises the frequency and the phase of the first current signal and the second moving window comprises a same signal length as the first moving window.

17. The system of claim 13, wherein the trigger event comprises a high impedance fault (HIF).

18. An electrical distribution system comprising:
an HIF detector comprising:
one or more sensors,
a processor, and
a non-transitory computer readable medium having stored thereon instructions that are executable by the processor to enable the HIF detector to perform operations comprising:
obtain a first current signal corresponding to a first electrical conductor of the electrical distribution system,
determine, based on a time period, a first moving window for the first current signal,
determine, based on the time period, a second moving window for a second current signal, the second current signal being generated based on the first current signal,
determine a first instantaneous phase of the first moving window and a second instantaneous phase of the second moving window,
determine a first frequency spectrum based on the first instantaneous phase and the first moving window and a second frequency spectrum based on the second instantaneous phase and the second moving window,
determine an error spectrum comprising one or more values corresponding to a difference between points from the first frequency spectrum and the second frequency spectrum respectively,
generate an error index for the first electrical conductor based on the first moving window and the second moving window; and
identify a trigger event for the first electrical conductor based on a comparison between the error index and a reference threshold.

19. The electrical distribution system of claim 18, wherein the second current signal comprises a pure sinusoidal wave signal generated based on the first current signal, the second current signal having a same length and phase as the first current signal;
wherein the first current signal comprises:
a frequency, and
a phase;
wherein the first moving window is defined based on a signal length; and
wherein the second current signal further comprises the frequency and the phase of the first current signal and the second moving window comprises a same signal length as the first moving window.

20. The electrical distribution system of claim 18, wherein the HIF detector further performs operations comprising:
adaptively determine the reference threshold based on the other electrical conductors of the electrical distribution system that are not undergoing the trigger event,
wherein the reference threshold comprises a parameter defining a sensitivity of detecting the trigger event.

* * * * *